(12) United States Patent
Jung et al.

(10) Patent No.: US 9,250,463 B2
(45) Date of Patent: Feb. 2, 2016

(54) DISPLAY APPARATUS HAVING IMPROVED STATIC DISCHARGE CHARACTERISTICS

(71) Applicant: Samsung Display Co., Ltd., Yongin, Gyeonggi-Do (KR)

(72) Inventors: Sang-Hun Jung, Icheon-si (KR); Dongwuuk Seo, Asan-si (KR); Sun-Jung Lee, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 151 days.

(21) Appl. No.: 14/021,924

(22) Filed: Sep. 9, 2013

(65) Prior Publication Data

US 2014/0009707 A1    Jan. 9, 2014

Related U.S. Application Data

(63) Continuation of application No. 13/207,367, filed on Aug. 10, 2011, now Pat. No. 8,531,640.

(30) Foreign Application Priority Data

Mar. 29, 2011    (KR) ........................ 10-2011-0028313

(51) Int. Cl.
| | | |
|---|---|---|
| *G02F 1/1343* | (2006.01) | |
| *G02F 1/1333* | (2006.01) | |
| *H01L 27/12* | (2006.01) | |
| *G02F 1/1362* | (2006.01) | |
| *H01L 29/417* | (2006.01) | |

(52) U.S. Cl.
CPC .... *G02F 1/133345* (2013.01); *G02F 1/134363* (2013.01); *G02F 1/136204* (2013.01); *H01L 27/124* (2013.01); *G02F 2001/134372* (2013.01); *H01L 29/41733* (2013.01)

(58) Field of Classification Search
CPC .................................................. G02F 1/134363
USPC .................................................... 349/58, 141
See application file for complete search history.

(56) References Cited

U.S. PATENT DOCUMENTS

| | | |
|---|---|---|
| 2001/0007779 A1 | 7/2001 | Lee et al. |
| 2001/0046027 A1 | 11/2001 | Tai et al. |
| 2002/0085156 A1 | 7/2002 | Lee |
| 2005/0078262 A1 | 4/2005 | Ono et al. |
| 2008/0284962 A1* | 11/2008 | Horiguchi ......... G02F 1/134363 349/139 |
| 2008/0284965 A1* | 11/2008 | Ryu .................... G02F 1/13439 349/141 |

FOREIGN PATENT DOCUMENTS

| | | |
|---|---|---|
| JP | 2008-165134 | 7/2008 |
| KR | 1020050121401 | 12/2005 |
| KR | 1020060105224 | 10/2006 |

* cited by examiner

*Primary Examiner* — Thanh-Nhan P Nguyen
(74) *Attorney, Agent, or Firm* — Innovation Counsel LLP

(57) ABSTRACT

A display apparatus includes a first substrate including a plurality of pixels, a second substrate, and a liquid crystal layer interposed between the first substrate and the second substrate. Each pixel includes a gate electrode, a gate insulating layer, a semiconductor pattern, a source electrode, a drain electrode, a first electrode, and a second electrode. The first electrode includes a first portion overlapping the drain electrode and a second portion outside the first portion, and the second electrode does not overlap the first portion of the first electrode. The first electrode or the second electrode is formed as a single unitary structure.

18 Claims, 6 Drawing Sheets

DISPLAY APPARATUS HAVING IMPROVED STATIC DISCHARGE CHARACTERISTICS

CROSS-REFERENCE TO RELATED APPLICATION

This application is a continuation of U.S. patent application Ser. No. 13/207,367 filed on Aug. 10, 2011, which claims priority under 35 U.S.C. §119 to Korean Patent Application No. 10-2011-0028313 filed on Mar. 29, 2011, the contents of which are herein incorporated by reference in their entirety.

BACKGROUND

1. Field of Disclosure

Embodiments of the present invention relate generally to a flat panel displays. More specifically, embodiments of the present invention relate to flat panel displays having improved static discharge characteristics.

2. Description of the Related Art

A liquid crystal display is one type of flat panel display. Liquid crystal displays can be classified as in-plane switching (IPS) mode liquid crystal displays, vertical alignment (VA) mode liquid crystal displays, or a plane-to-line switching (PLS) mode liquid crystal displays.

The PLS mode liquid crystal display drives its liquid crystal layer using horizontal and vertical electric fields to display an image. In the PLS mode liquid crystal display, liquid crystal molecules in the liquid crystal layer are rotated almost parallel to a substrate surface by a strong fringe electric field.

SUMMARY

Exemplary embodiments of the present invention provide a display apparatus having improved display quality.

According to the exemplary embodiments, a display apparatus includes a first substrate including a plurality of pixels, a second substrate facing the first substrate, and a liquid crystal layer interposed between the first substrate and the second substrate.

Each pixel includes a gate electrode, a gate insulating layer, a semiconductor pattern, a source electrode, a drain electrode, a first electrode, and a second electrode.

The gate electrode is disposed on a first insulating substrate and the gate insulating layer is disposed on the first insulating substrate over the gate electrode. The semiconductor pattern is disposed on the gate insulating layer to overlap the gate electrode. The source electrode and the drain electrode are disposed on the semiconductor pattern to be spaced apart from each other. The first electrode is disposed on the gate insulating layer and connected to the drain electrode. The second electrode overlaps the first electrode when viewed in a plan view, so as to form an electric field in cooperation with the first electrode when a voltage is applied across the first and second electrodes. The first electrode includes a first portion overlapping the drain electrode and a second area that does not overlap the drain electrode, and the second electrode does not overlap the first portion of the first electrode.

A plurality of gate lines extending at least approximately in a first direction and a plurality of data lines extending at least approximately in a second direction crossing the first direction are disposed on the first insulating substrate. Each pixel is connected to a corresponding gate line of the gate lines and a corresponding data line of the data lines.

A passivation layer is disposed on the first electrode to cover the first electrode, and the second electrode is disposed on the passivation layer. The second electrode includes a plurality of slits formed by partially removing the second electrode.

An organic insulating layer is disposed between the gate insulating layer and the first electrode and provided with a contact hole exposing a portion of the drain electrode, and the first electrode is connected to the drain electrode through the contact hole.

The second electrode is disposed between the first insulating substrate and the gate insulating layer to be electrically insulated from the gate electrode. The first electrode includes a plurality of slits formed by partially removing the first electrode.

According to the above, short circuits caused by static electricity and generated between the first electrode and the second electrode may be prevented, so that the display apparatus may have improved display quality.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION

Figure 1:
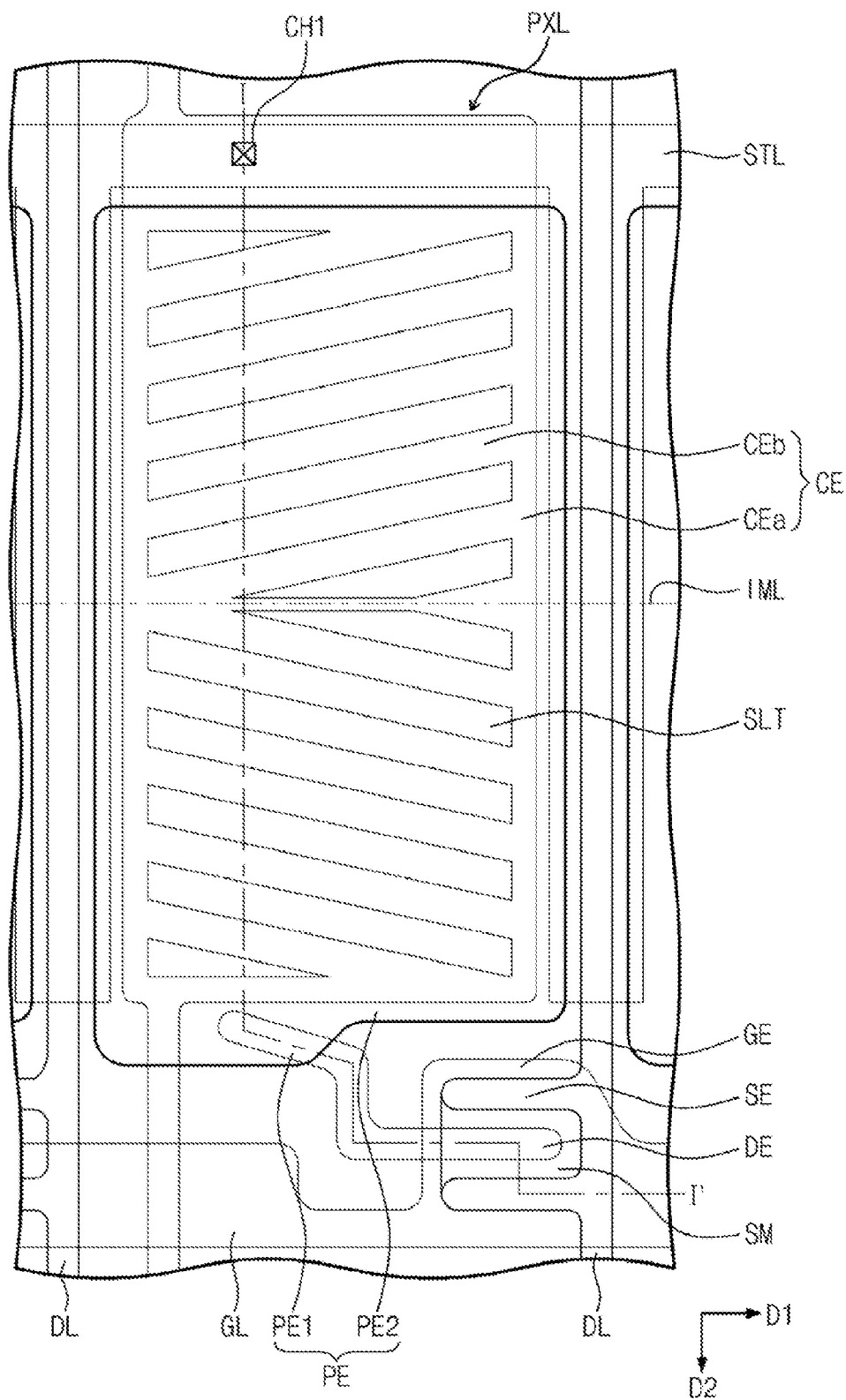
FIG. 1 is a plan view showing a portion of a display apparatus manufactured by a manufacturing method according to a first exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
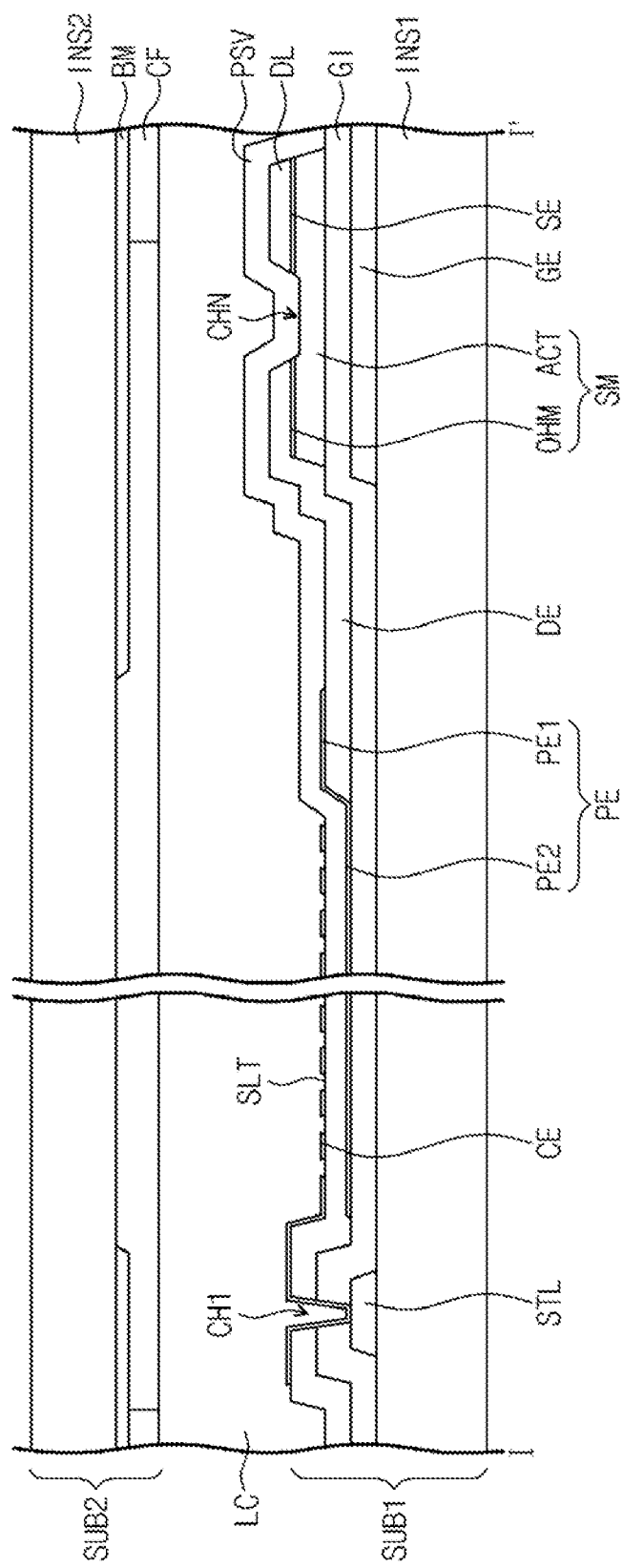
FIG. 2 is a cross-sectional view taken along a line I-I' shown in FIG. 1.

FIG. 1 is a plan view showing a portion of a display apparatus manufactured by a manufacturing method according to a first exemplary embodiment of the present invention. FIG. 2 is a cross-sectional view taken along a line I-I' shown in FIG. 1. In the first exemplary embodiment, for ease of explanation, one pixel will be shown with its adjacent gate lines and data lines.

Referring to FIGS. 1 and 2, the display apparatus includes a first substrate SUB1, a second substrate SUB2 facing the first substrate SUB1, and a liquid crystal layer LC disposed between the first substrate SUB1 and the second substrate SUB2.

The first substrate SUB1 includes a first insulating substrate INS1, a plurality of gate lines GL, a plurality of data lines DL, and a plurality of pixels PXL. The first insulating substrate INS1 has a generally rectangular plate-like shape and includes a transparent insulating material.

The gate lines GL are arranged on the first insulating substrate INS1 to extend generally in a first direction D1.

A gate insulating layer GI is disposed on the first insulating substrate INS1 to cover the gate lines GL. The gate insulating layer GI may include an insulating material, such as silicon nitride or silicon oxide.

The data lines DL are arranged on the gate insulating layer GI to extend generally in a second direction D2 crossing (e.g., perpendicular to) the first direction D1.

Each pixel PXL is connected to a corresponding gate line of the gate lines GL and a corresponding data line of the data lines DL. Each pixel PXL includes a thin film transistor, a pixel electrode PE connected to the thin film transistor, a passivation layer PSV covering the pixel electrode PE, a common electrode CE spaced apart from the pixel electrode PE, and a storage line STL connected to the common electrode CE and overlapping the pixel electrode PE to form a storage capacitor. The thin film transistor includes a gate electrode GE, a gate insulating layer GI, a semiconductor pattern SM, a source electrode SE, and a drain electrode DE.

The gate electrode GE extends from the gate line GL or is provided on a portion of the gate line GL.

The gate electrode GE may include a metal material such as nickel, chromium, molybdenum, aluminum, titanium, copper, tungsten, or an alloy thereof. The gate electrode GE may have a single-layer structure or a multi-layer structure. For instance, the gate electrode GE may have a triple-layer structure of molybdenum, aluminum, and molybdenum which are sequentially stacked one on another, or a double-layer structure of titanium and copper that are sequentially stacked one on another. In addition, the gate electrode GE may have a single-layer structure of an alloy of titanium and copper.

The gate insulating layer GI is disposed on entire surface of the first insulating substrate INS1 to cover the gate line GL.

The semiconductor pattern SM is disposed on the gate insulating layer GI. The semiconductor pattern SM is disposed on the gate electrode GE with the gate insulating layer GI interposed therebetween, such that a portion of the semiconductor pattern SM is overlapped with the gate electrode GE. The semiconductor pattern SM includes an active pattern ACT disposed on the gate insulating layer GI and an ohmic contact layer OHM disposed on the active pattern ACT. The active pattern ACT may be an amorphous silicon thin layer, and the ohmic contact layer OHM may be an n+ amorphous silicon thin layer. The ohmic contact layer OHM is provided between a portion of the active pattern ACT and the source electrode SE, and between a remaining portion of the active pattern ACT and the drain electrode DE. The ohmic contact layer OHM improves electrical contact between the active pattern ACT and the source electrode SE, and between the active pattern ACT and the drain electrode DE.

The source electrode SE branches from the data line DL. The source electrode SE is disposed on the ohmic contact layer OHM, and a portion of the source electrode SE is overlapped with the gate electrode GE.

The drain electrode DE is spaced apart from the source electrode SE. The drain electrode DE is disposed on the ohmic contact layer OHM, and a portion of the drain electrode DE is overlapped with the gate electrode GE.

The source electrode SE and the drain electrode DE may include nickel, chromium, molybdenum, aluminum, titanium, copper, tungsten, or an alloy thereof. The source electrode SE and the drain electrode DE may have a single-layer structure or a multi-layer structure. For instance, each of the source electrode SE and the drain electrode DE may have a double-layer structure of titanium and copper sequentially stacked one on another, or a single-layer structure of an alloy of titanium and copper.

Thus, a portion of the upper surface of the active pattern ACT is exposed between the source electrode SE and the drain electrode DE, and the active pattern ACT serves as a channel portion CHN between the source electrode SE and the drain electrode DE according to application of a voltage to the gate electrode GE. The source electrode SE and the drain electrode DE overlap a portion of the semiconductor pattern SM but do not overlap in the area in which the channel portion CHN is formed.

The pixel electrode PE is disposed on the drain electrode DE and the gate insulating layer GI. A portion of the pixel electrode PE is disposed on a portion of the drain electrode DE and the gate insulating layer GI, and is connected to the drain electrode DE. Accordingly, when viewed in a plan view, a portion of the pixel electrode PE overlaps the drain electrode DE. In the present exemplary embodiment, the pixel electrode PE has a generally rectangular shape in a plan view, but it should not be limited thereto or thereby. The pixel electrode PE may be formed as a single unitary part or structure, without any patterns therein. The pixel electrode PE may have a shape corresponding approximately to the shape of the gate electrode GE in the area adjacent to the cross portion of the gate line GL and the data line DL (i.e. the area in which the gate line GL and data line DL overlap). More specifically, as shown in FIG. 1, the gate electrode GE may shaped so as to protrude toward the pixel electrode PE located in the pixel PXL, and the pixel electrode PE may have a recessed portion corresponding to the protruded portion of the gate electrode GE, so that the pixel electrode PE does not overlap the protruded portion of the gate electrode GE. In this case, the area adjacent to the cross portion of the gate line GL and the data line DL is an area in which the thin film transistor is formed, with the protruded portion of the gate electrode GE overlapping with the semiconductor pattern SM of the thin film transistor. As described above, when an outer portion of the pixel electrode PE is formed with a recess to accomodate the shape of the gate electrode GE, an aperture ratio of the pixel PXL may be increased.

The pixel electrode PE is formed of a transparent conductive material. Particularly, the pixel electrode PE can be formed of a transparent conductive oxide, such as indium tin oxide (ITO), indium zinc oxide (IZO), indium tin zinc oxide (ITZO), etc.

The passivation layer PSV is disposed on the first insulating substrate INS1 on which the pixel electrode PE is formed. The passivation layer PSV covers the channel portion CHN and the pixel electrode PE. The passivation layer PSV may include any suitable material, such as silicon nitride or silicon oxide.

The common electrode CE is disposed on the passivation layer PSV. The common electrode CE overlaps a portion of the pixel electrode PE. When viewed in a plan view, the common electrode CE does not overlap that portion of the pixel electrode PE which is formed on the drain electrode DE, nor does it overlap the drain electrode DE itself. If the area in which the pixel electrode PE overlaps the drain electrode DE is referred to as a first area PE1, and an area in which the pixel electrode PE does not overlap the drain electrode DE is referred to as a second area PE2, the common electrode CE is formed in the second area PE2 but not in the first area PE1.

The common electrode CE includes a plurality of slits SLT that are formed by partially removing the common electrode CE. The slits SLT may be inclined with respect to the first direction D1 or the second direction D2. In addition, different ones of the slits SLT may have different inclination directions, and the slits SLT may be positioned in line-symmetry with respect to an imaginary line crossing the pixel PXL or in point-symmetry with respect to a position in the pixel PXL. The slits SLT may also be positioned in any other manner, such as according to some other form of symmetry, or having no symmetry. In FIG. 1, the slits SLT are positioned in line-symmetry with respect to an imaginary line IML crossing the pixel PXL along the first direction D1.

In other words, the common electrode CE includes a portion CEa (hereinafter, referred to as trunk portion) formed in each pixel PXL and portions CEb (hereinafter, referred to as branch portions) divided by the slits SLT and protruded from the trunk portion CEa. The branch portions CEb are spaced apart from each other at regular intervals. The branch portions CEb of the common electrode CE form an electric field together with the pixel electrode PE.

The branch portions CEb may be extended in parallel to each other and the trunk portion CEa and the branch portions CEb may have various shapes. For instance, the branch portions CEb may be protruded from the trunk portion CEa in both directions substantially oblique to the extended direction of the trunk portion CEa. In addition, although not shown in FIGS. 1 and 2, the trunk portion CEa may be bent several times.

The common electrode CE may include a connection line extended in a predetermined direction to connect the common electrode CE to an adjacent common electrode disposed in an adjacent pixel. In the present exemplary embodiment, the connection line is extended in its width direction along the second direction D2, thereby electrically connecting the common electrodes of adjacent pixels.

The common electrode CE may be formed of a transparent conductive material. For instance, the common electrode CE may include a conductive metal oxide material, such as indium tin oxide (ITO), indium zinc oxide (IZO), indium tin zinc oxide (ITZO), etc The storage line STL is disposed between the first insulating substrate INS1 and the gate insulating layer GI to be spaced apart from the gate line GL. The storage line STL may be formed of the same material as the gate line GL and thus, the storage line STL may be formed by the same process as the gate line GL.

The storage line STL is extended generally in the first direction D1 and has a protrusion extending generally in the second direction D2 to overlap with portions of the pixel electrode PE and the data line DL. The storage line STL and the pixel electrode PE form a storage capacitor along with the gate insulating layer GI that is disposed therebetween.

The gate insulating layer GI and the passivation layer PSV include a first contact hole CH1 formed by partially removing the gate insulating layer GI and the passivation layer PSV to expose a portion of the storage line STL. The common electrode CE is connected to the storage line STL through the first contact hole CH1. The storage line STL and common electrode CE thus receive the same voltage, i.e. the common voltage. In the present exemplary embodiment, since the common voltage is applied to the common electrode CE in each pixel through the storage line STL, the common voltage applied to the common electrode CE of each pixel may be substantially uniform, without voltage-drop.

The second substrate SUB2 includes a second insulating substrate INS2, color filters CF, and a black matrix BM. The color filters CF impart a color to light passing through the liquid crystal layer LC. The color filters CF include a red color filter, a green color filter, and a blue color filter. The red color filter, the green color filter, and the blue color filter may be arranged to correspond to the pixels PXL in one-to-one correspondence. The black matrix BM is disposed between pixels to block the light that travels between the pixels.

The liquid crystal layer LC, including liquid crystal molecules, is disposed between the first substrate SUB1 and the second substrate SUB2.

When a gate signal is applied to the gate line GL, the thin film transistor is turned on. This allows a data signal applied to the data line DL to then be provided to the pixel electrode PE through the turned-on thin film transistor, and thus an electric field is generated between the pixel electrode PE and the common electrode CE. In this case, the voltage applied to the pixel electrode PE is larger or smaller than the voltage applied to the common electrode CE. For instance, a voltage of about zero volts and a voltage of about 7 volts may be applied to the common electrode CE and the pixel electrode PE, respectively. The liquid crystal molecules in the liquid crystal layer may be driven by the voltage difference between the common electrode CE and the pixel electrode PE. As a result, the amount of light passing through the liquid crystal layer LC is changed, thereby displaying an image.

Accordingly, the display apparatus may prevent pixel defects from occurring, which is caused by static electricity. In detail, since the common electrode CE is spaced apart from the first area PE1 in which the pixel electrode PE overlaps the drain electrode DE, short circuits caused by static electricity may be prevented. More specifically, the first area PE1 in which the pixel electrode PE is overlapped with the drain electrode DE has the characteristic of high-resistance, so that static electricity more easily accumulates here and short circuits caused by static discharge (i.e. burns) more easily occur. When the pixel electrode PE is shorted to the common electrode CE by these burns, the voltage difference between the pixel electrode PE and the common electrode CE becomes zero volts. Consequently, the liquid crystal molecules of the liquid crystal layer do not move from their initially-fixed original position, and thus the pixel does not operate properly. According to the present exemplary embodiment, since the common electrode CE is spaced apart from the first area PE1, short circuits may be more effectively prevented. Thus, the display apparatus may have higher image display quality.

Figure 3:
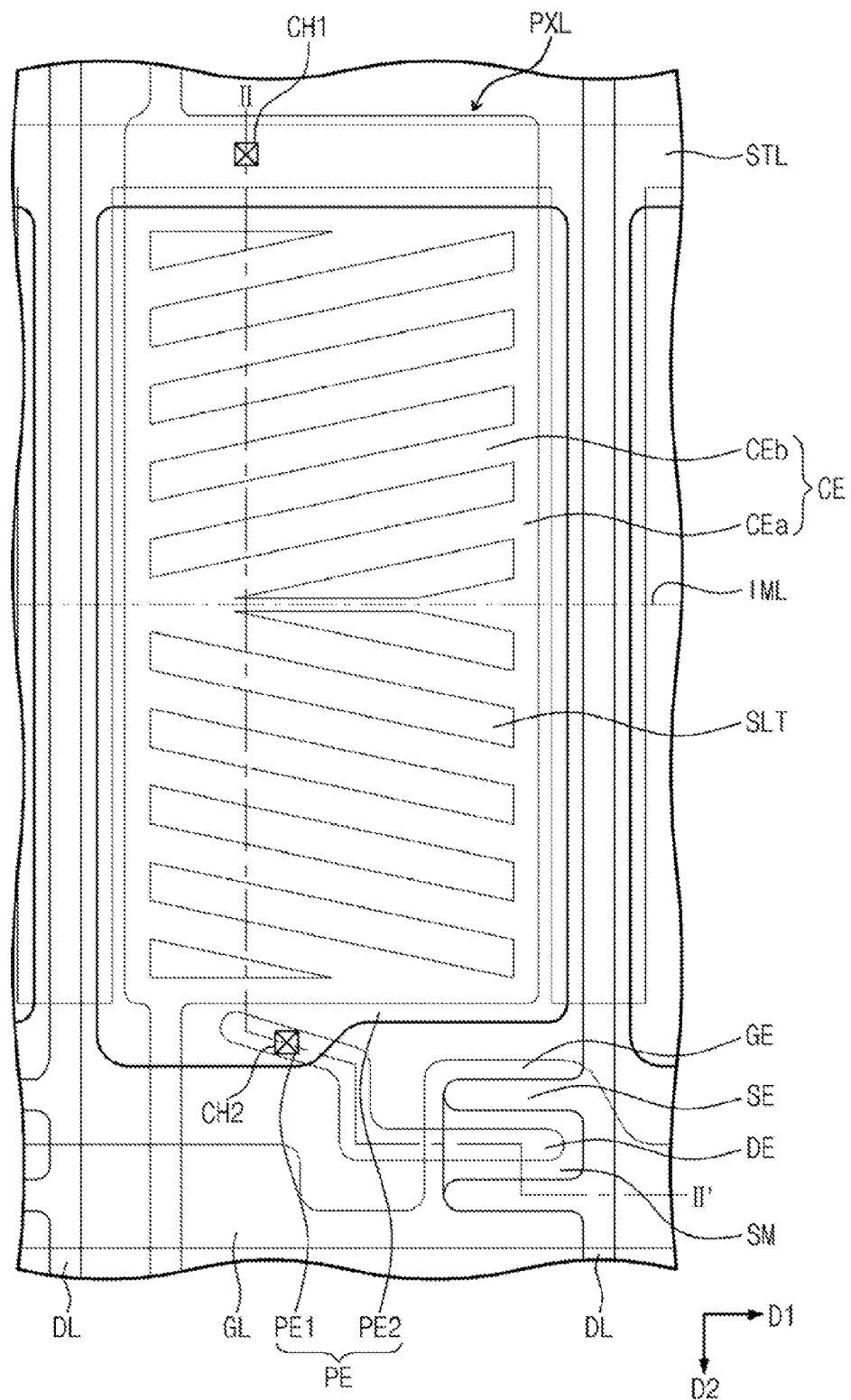
FIG. 3 is a plan view showing a portion of a display apparatus manufactured by a manufacturing method according to a second exemplary embodiment of the present invention.
Figure 4:
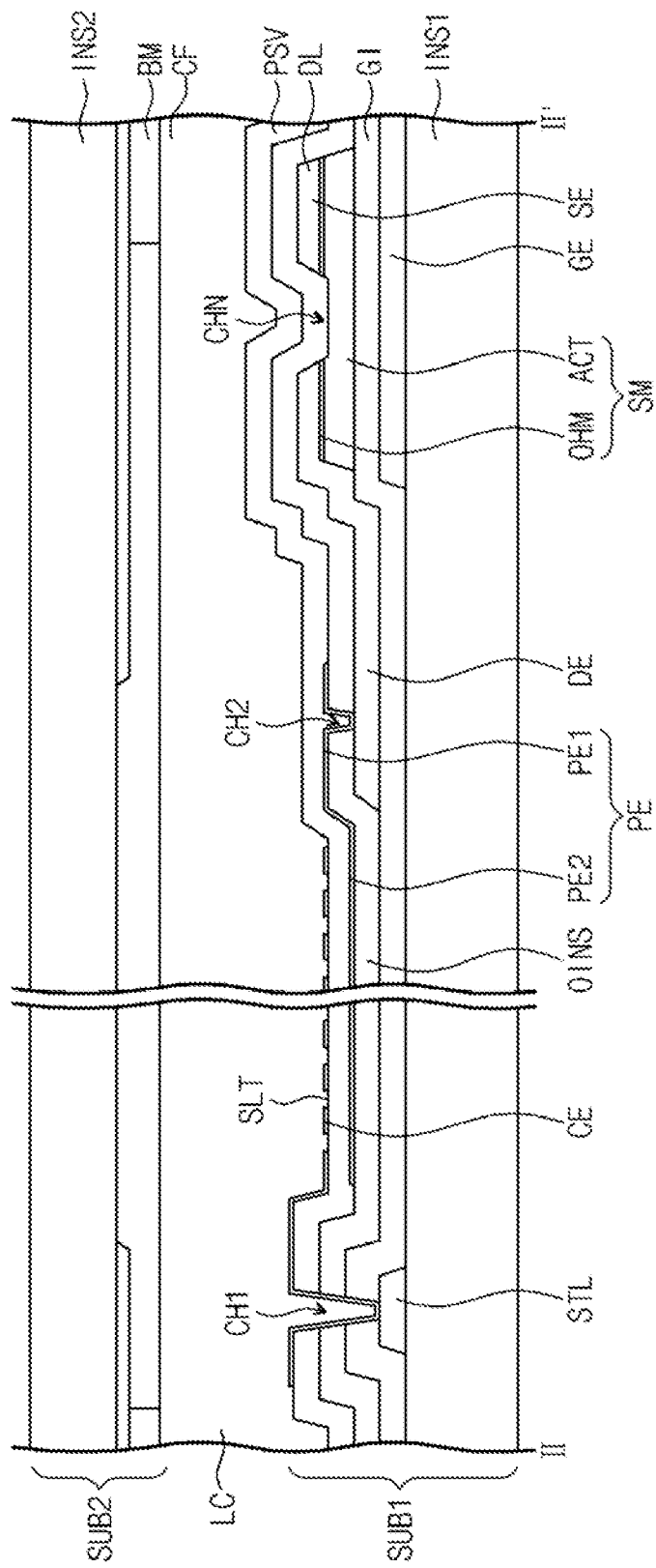
FIG. 4 is a cross-sectional view taken along a line II-II' shown in FIG. 3.

FIG. 3 is a plan view showing a portion of a display apparatus manufactured by a manufacturing method according to a second exemplary embodiment of the present invention, and FIG. 4 is a cross-sectional view taken along a line II-II' shown in FIG. 3. In the second exemplary embodiment, for the convenience of explanation, one pixel will be shown with the corresponding adjacent gate lines and data lines. In addition, in FIGS. 3 and 4, the same reference numerals denote the same elements in FIGS. 1 and 2, and thus detailed descriptions of the same elements will be omitted.

Referring to FIGS. 3 and 4, the first substrate SUB1 includes a first insulating substrate INS1, a plurality of gate lines GL, a plurality of data lines DL, and a plurality of pixels PXL. The first insulating substrate SUB1 has a rectangular shape and includes a transparent insulating material.

The gate lines GL are arranged on the first insulating substrate INS1 and extend generally in the first direction D1.

The gate insulating layer GI is disposed on the first insulating substrate INS1 to cover the gate lines GL disposed on the first insulating substrate INS1.

The data lines DL are arranged on the gate insulating layer GI and extend generally in the second direction D2 substantially perpendicular to the first direction D1.

Each pixel PXL is connected to one gate line of the gate lines GL and one data line of the data lines DL. Each pixel PXL includes a thin film transistor, a pixel electrode PE connected to the thin film transistor with an organic insulating layer interposed therebetween, a passivation layer PSV covering the pixel electrode PE, a common electrode CE spaced apart from the pixel electrode PE, and a storage line STL connected to the common electrode CE and overlapping the pixel electrode PE to form a storage capacitor. The thin film transistor includes a gate electrode GE, the gate insulating layer GI, a semiconductor pattern SM, a source electrode SE, and a drain electrode DE.

The gate electrode GE protrudes from the gate line GL, or is provided on a portion of the gate line GL.

The gate insulating layer GI is disposed on substantially the entire surface of the first insulating substrate INS1 to cover the gate line GL.

The semiconductor pattern SM is disposed on the gate insulating layer GI. The semiconductor pattern SM is disposed on the gate electrode GE with the gate insulating layer GI interposed therebetween, such that a portion of the semiconductor pattern SM overlaps the gate electrode GE.

The source electrode SE branches from the data line DL and a portion of the source electrode SE overlaps the gate electrode GE. The drain electrode DE is spaced apart from the source electrode SE and a portion of the drain electrode DE overlaps the gate electrode GE.

An organic insulating layer OINS is disposed on the first insulating substrate INS1 to cover the data line DL, the source electrode SE, and the drain electrode DE, each of which are disposed on the first insulating substrate INS1. The organic insulating layer OINS may include a polymer resin. The organic insulating layer OINS is provided with a first contact hole CH1 to expose a portion of the storage line STL and a second contact hole CH2 to expose a portion of the drain electrode DE.

The pixel electrode PE is disposed on the organic insulating layer OINS and is formed as a single unitary structure without any holes or patterns, e.g., slits, therein. In the present exemplary embodiment, when viewed in a plan view, the portion of the pixel electrode PE is overlapped with the drain electrode DE and connected to the drain electrode DE through the second contact hole CH2.

The passivation layer PSV is disposed on the first insulating substrate INS1 on which the pixel electrode PE is formed. The passivation layer PSV covers the pixel electrode PE and includes the first contact hole CH1 through which the portion of the storage line STL is exposed. That is, first contact hole CH1 is formed through passivation layer PSV.

The common electrode CE is disposed on the passivation layer PSV. The common electrode CE overlaps a portion of the pixel electrode PE. When viewed in a plan view, the common electrode CE does not overlap that portion of the pixel electrode PE which overlaps the drain electrode DE. That is, referring to the area of overlap between the pixel electrode PE and referring to the drain electrode DE as a first area PE1 and an area of overlap between the pixel electrode PE and the drain electrode DE as a second area PE2, the common electrode CE is does not overlap the first area PE1, i.e. the common electrode CE is not formed on the first area PE1.

The common electrode CE includes a plurality of slits SLT that is formed by partially removing the common electrode CE. In other words, the common electrode CE includes a portion CEa (hereinafter, referred to as trunk portion) formed in each pixel PXL and portions CEb (hereinafter, referred to as branch portions) protruded from the trunk portion CEa. The branch portions CEb are spaced apart from each other at regular intervals. The branch portions CEb of the common electrode CE form an electric field together with the pixel electrode PE.

The storage line STL is disposed between the first insulating substrate INS1 and the gate insulating layer GI, and is spaced apart from the gate line GL. The storage line STL extends generally in the first direction D1 and has a portion protruding generally in the second direction D2 to overlap with portions of the pixel electrode PE and the data line DL. The storage line STL and the pixel electrode PE form the storage capacitor together with the gate insulating layer GI disposed therebetween.

The common electrode CE is connected to the storage line STL through the first contact hole CH1. The storage line STL and common electrode CE thus receive the same voltage, i.e. the common voltage.

The second substrate SUB2 includes a second insulating substrate SUB2 and color filters CF.

The liquid crystal layer LC, which contains liquid crystal molecules, is disposed between the first substrate SUB1 and the second substrate SUB2.

In the display apparatus according to the second exemplary embodiment, the storage line STL forms a storage capacitor together with the pixel electrode PE with the gate insulating layer GI and the organic insulating layer OINS positioned therebetween. The organic insulating layer OINS may be thicker than a corresponding inorganic insulating layer.

Figure 5:
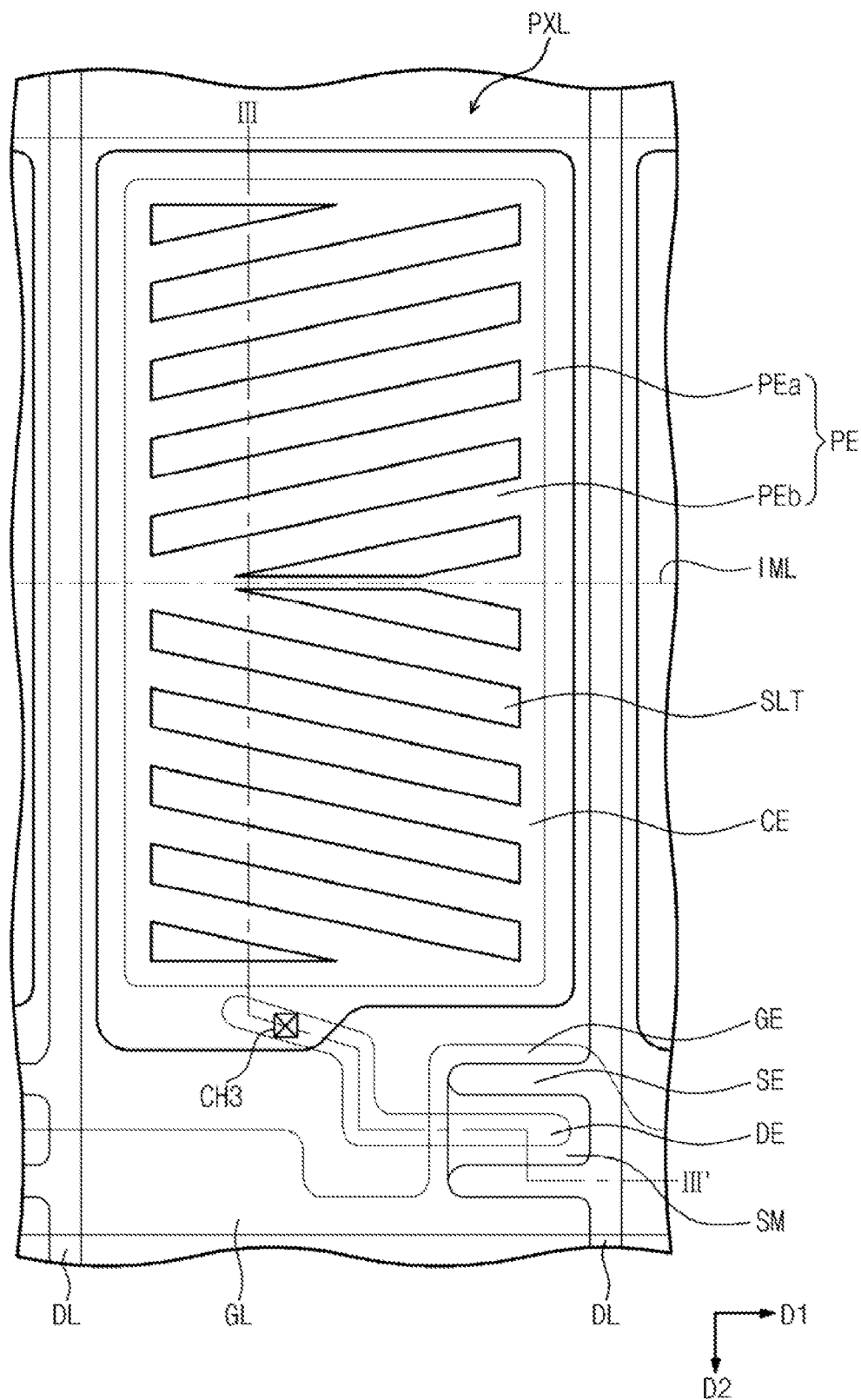
FIG. 5 is a plan view showing a portion of a display apparatus manufactured by a manufacturing method according to a third exemplary embodiment of the present invention.
Figure 6:
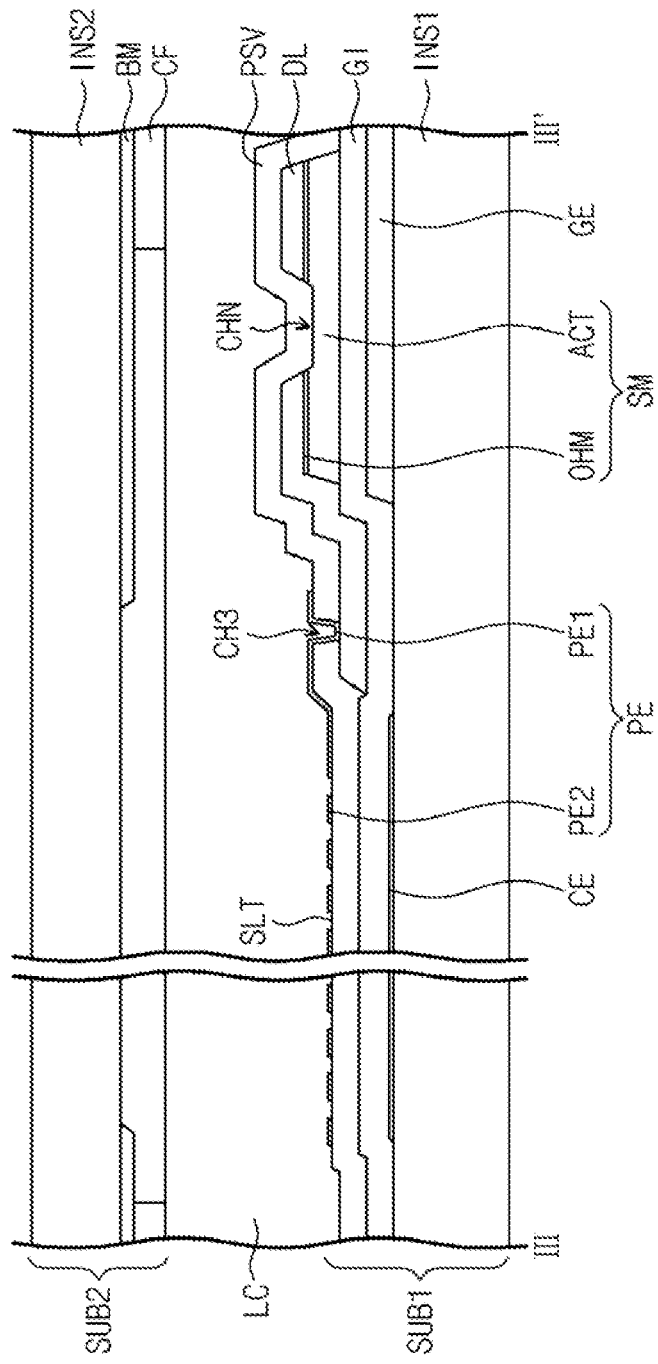
FIG. 6 is a cross-sectional view taken along a line III-III' shown in FIG. 5.

FIG. 5 is a plan view showing a portion of a display apparatus manufactured by a manufacturing method according to a third exemplary embodiment of the present invention, and FIG. 6 is a cross-sectional view taken along a line III-III' shown in FIG. 5. In FIGS. 5 and 6, the same reference numerals denote the same elements in FIGS. 1 and 2, and thus detailed descriptions of the same elements will be omitted.

Referring to FIGS. 5 and 6, the display apparatus includes a first substrate SUB1, a second substrate SUB2 facing the first substrate SUB1, and a liquid crystal layer LC disposed between the first substrate SUB1 and the second substrate SUB2.

The first substrate SUB1 includes a first insulating substrate INS1, a plurality of gate lines GL, a plurality of data lines DL, and a plurality of pixels PXL.

The gate lines GL are arranged on the first insulating substrate INS1 and extend generally in the first direction D1. The gate insulating layer GI is disposed on the first insulating substrate INS1 to cover the gate lines GL.

The data lines DL are arranged on the gate insulating layer GI and extend generally in the second direction D2, which is substantially perpendicular to the first direction D1.

Each pixel PXL is connected to one gate line of the gate lines GL, and one data line of the data lines DL. Each pixel PXL includes a thin film transistor, a pixel electrode PE connected to the thin film transistor, a passivation layer PSV covering the pixel electrode PE, and a common electrode CE spaced apart from the pixel electrode PE and overlapping the pixel electrode PE.

The common electrode CE is disposed on the first insulating substrate INS1. The common electrode CE is disposed between adjacent gate lines GL when viewed in a plan view. A portion of the common electrode CE extends generally in the first direction D1 and is connected to a portion of an adjacent common electrode CE. The common electrode CE in each pixel receives the same voltage level.

The common electrode CE has a rectangular shape in each pixel, but the invention is not limited thereto or thereby. That is, the common electrode CE may have various shapes according to the shape of various embodiments' pixels. In addition, the common electrode CE may be formed as a single unitary structure or part without any patterns cut out from therein.

The thin film transistor includes a gate electrode GE, a gate insulating layer GI, a semiconductor pattern SM, a source electrode SE, and a drain electrode DE.

The gate electrode GE protrudes from the gate line GL, or is provided on a portion of the gate line GL.

The gate insulating layer GI is disposed on substantially an entire surface of the first insulating substrate INS1 to cover the gate line GL, the gate electrode, and the common electrode CE.

The semiconductor pattern SM is disposed on the gate insulating layer GI. The semiconductor pattern SM is disposed on the gate electrode GE with the gate insulating layer GI interposed therebetween, such that a portion of the semiconductor pattern SM overlaps the gate electrode GE. The semiconductor pattern SM includes an active pattern ACT disposed on the gate insulating layer GI, and an ohmic contact layer OHM disposed on the active pattern ACT.

The source electrode SE branches from the data line DL. The drain electrode DE is spaced apart from the source electrode SE over the active pattern ACT. Thus, a portion of upper surface of the active pattern ACT is exposed between the source electrode SE and the drain electrode DE, and the active pattern ACT serves as a channel portion CHN between the source electrode SE and the drain electrode DE according to application of a voltage to the gate electrode GE. The source electrode SE and the drain electrode DE overlap portions of the semiconductor pattern SM, but leave part of the pattern SM exposed, so as to form the channel portion CHN.

The passivation layer PSV is disposed on the first insulating substrate INS1 to cover the data line DL, the source electrode SE, the drain electrode De, and the channel portion CHN. The passivation layer PSV has a third contact hole CH3 formed therethrough, which exposes a portion of the drain electrode DE.

The pixel electrode PE is disposed on the passivation layer PSV to overlap the common electrode CE, and is connected to the drain electrode DE through the third contact hole CH3. Accordingly, a portion of the pixel electrode PE overlaps the drain electrode DE when viewed in a plan view.

The pixel electrode PE has a generally rectangular shape in a plan view, but the invention is not limited thereto or thereby. That is, the pixel electrode PE may have various shapes according to the shape of the corresponding pixel. In addition, the pixel electrode PE includes a plurality of slits SLT that is formed by partially removing the pixel electrode PE. In other words, the pixel electrode PE includes a trunk portion PEa formed in each pixel PXL, and branch portions PEb protruded from the trunk portion. The branch portions are spaced apart from each other at regular intervals. The branch portions of the pixel electrode PE form an electric field together with the common electrode CE.

The common electrode CE overlaps the pixel electrode PE. However, when viewed in a plan view, the common electrode CE does not overlap that portion of the pixel electrode PE which overlaps the drain electrode DE. That is, if the area of overlap between the pixel electrode PE and drain electrode DE is referred to as a first area PE1 and an area in which the pixel electrode PE does not overlap the drain electrode DE is referred to as a second area PE2, the common electrode CE does not extend into (i.e., is not formed in) the first area PE1 but is instead spaced apart from the first area PE1. The common electrode CE is only formed in the second area PE2.

The second substrate SUB2 includes a second insulating substrate INS2 and color filters CF. The color filters CF can allow light passing through the liquid crystal layer LC to have a color.

The liquid crystal layer LC including the liquid crystal molecules is disposed between the first substrate SUB1 and the second substrate SUB2.

As described above, different from the first and second exemplary embodiments, the common electrode CE is disposed under the pixel electrode PE in the third exemplary embodiment, but short circuits caused by the static electricity may be prevented in a manner similar to the first exemplary embodiment.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

The invention claimed is:

1. A display apparatus comprising:
a first insulating substrate;
a second insulating substrate facing the first insulating substrate;
a liquid crystal layer interposed between the first insulating substrate and the second insulating substrate;
a gate line disposed on the first insulating substrate and extending in a first direction;
a data line extending in a second direction crossing the first direction;
a thin film transistor connected to the gate line and the data line;
a first electrode connected to the thin film transistor;
a second electrode overlapping the first electrode and separated from the data line in a plan view; and,
a third electrode disposed adjacent to the second electrode in a second direction,
wherein the second electrode comprises a slit tilting at an acute angle with respect to the first direction and the second electrode is electrically connected to the third electrode through a connection line, and
wherein the second electrode doesn't overlap the thin film transistor in a plan view.

2. The display apparatus of claim 1, further comprising an organic insulating layer,
wherein the organic insulating layer covers the thin film transistor and has a first contact hole to expose a portion of the thin film transistor, and
wherein the second electrode is separated from the first contact hole.

3. The display apparatus of claim 2, further comprising a storage line disposed on the first insulating substrate and extending in the first direction,
wherein the storage line is separated from the gate line and connected to the second electrode to apply a common voltage.

4. The display apparatus of claim 3, wherein a portion of the storage line extends in the second direction and overlaps a portion of the first electrode.

5. The display apparatus of claim 3, further comprising a passivation layer covering the first electrode, wherein the second electrode is disposed on the passivation layer.

6. The display apparatus of claim 5, wherein the gate insulating layer and the passivation layer have a second contact hole to expose a portion of the storage line, and the second electrode is connected to the storage line through the second contact hole.

7. The display apparatus of claim 3, wherein the storage line comprises the same material as a material of the gate line.

8. The display apparatus of claim 1, wherein the thin film transistor comprises:
a gate electrode disposed on the first insulating substrate;
a gate insulating layer disposed on the first insulating substrate over the gate electrode;
a semiconductor pattern disposed on the gate insulating layer to overlap the gate electrode;
a source electrode disposed on the semiconductor pattern; and
a drain electrode disposed on the semiconductor pattern to be spaced apart from the source electrode.

9. The display apparatus of claim 8, wherein the drain electrode comprises a first portion overlapping the semiconductor pattern and a second portion connected to the first portion in a plan view, and
wherein the second portion overlaps the first electrode and doesn't overlap the second electrode.

10. The display apparatus of claim 9, wherein, for each pixel, a portion of the gate electrode extends from the gate line to the first electrode, and a portion of the first electrode has a recessed portion positioned to correspond to the extended portion of the gate electrode.

11. The display apparatus of claim 10, wherein, for each pixel, the extended portion of the gate electrode overlaps the semiconductor pattern.

12. The display apparatus of claim 8, wherein each of the source electrode and the drain electrode comprises nickel, copper, tungsten, or an alloy thereof.

13. The display apparatus of claim 8, wherein the first electrode and the second electrode each comprise a transparent conductive oxide.

14. The display apparatus of claim 1, wherein the first electrode is a pixel electrode formed as a single unitary structure.

15. The display apparatus of claim 1, wherein the slits are substantially in line-symmetry with respect to an imaginary line crossing a center of the second electrode along the first direction.

16. The display apparatus of claim 1, wherein the second electrode comprises a trunk portion and branch portions divided by the slits and protruded from the trunk portion.

17. The display apparatus of claim 16, wherein the branch portions are substantially oblique to the trunk portion.

18. The display apparatus of claim 1, wherein the connection line, the second electrode, and the third electrode are disposed on a same layer.

* * * * *